(12) United States Patent
Zagdoun et al.

(10) Patent No.: US 8,808,790 B2
(45) Date of Patent: Aug. 19, 2014

(54) METHOD FOR MANUFACTURING A SUBMILLIMETRIC ELECTRICALLY CONDUCTIVE GRID COATED WITH AN OVERGRID

(75) Inventors: Georges Zagdoun, La Garenne Colombes (FR); Bernard Nghiem, Arsy (FR); Eddy Royer, Villemomble (FR)

(73) Assignee: Saint-Gobain Glass France, Courbevoie (FR)

( * ) Notice: Subject to any disclaimer, the term of this patent is extended or adjusted under 35 U.S.C. 154(b) by 648 days.

(21) Appl. No.: 13/120,580

(22) PCT Filed: Sep. 25, 2009

(86) PCT No.: PCT/FR2009/051822
§ 371 (c)(1),
(2), (4) Date: Jun. 23, 2011

(87) PCT Pub. No.: WO2010/034950
PCT Pub. Date: Apr. 1, 2010

(65) Prior Publication Data
US 2011/0248219 A1 Oct. 13, 2011

(30) Foreign Application Priority Data

Sep. 25, 2008 (FR) ..................... 08 56448

(51) Int. Cl.
*B05D 5/12* (2006.01)
*H05K 3/04* (2006.01)
(Continued)

(52) U.S. Cl.
CPC ............. *H05K 3/048* (2013.01); *C23C 14/04* (2013.01); *C23C 16/04* (2013.01); *C23C 18/06* (2013.01); *B05D 1/32* (2013.01); *B05D 5/12* (2013.01)
USPC ....... 427/97.3; 427/97.6; 427/98.4; 427/99.2; 427/282

(58) Field of Classification Search
USPC .............. 427/97.3, 97.6, 98.4, 99.2, 123, 282
See application file for complete search history.

(56) References Cited

U.S. PATENT DOCUMENTS 4,324,815 A * 4/1982 Mitani et al. ................. 427/98.4
(Continued)

FOREIGN PATENT DOCUMENTS

DE 197 33 053 2/1999
DE 20 2005 000 979 7/2006
(Continued)

OTHER PUBLICATIONS

International Preliminary Report on Patentability, including the Written Opinion dated Feb. 18, 2010, as issued for PCT/FR2009/051822, dated May 31, 2011.
(Continued)

*Primary Examiner* — Brian K Talbot
(74) *Attorney, Agent, or Firm* — Pillsbury Winthrop Shaw Pittman LLP

(57) ABSTRACT

A method of manufacturing a submillimetric electroconductive grid coated with an overgrid on a substrate includes: the production of a mask having submillimetric openings by the deposition of a solution of colloidal polymeric nanoparticles that are stabilized and dispersed in a solvent, the polymeric particles having a glass transition temperature $T_g$ and the drying of the masking layer at a temperature below the $T_g$ until the mask, with straight edges, is obtained, the formation of the electroconductive grid by a deposition of electroconductive material, referred to as grid material, a heat treatment of the masking layer with the grid material at a temperature greater than or equal to 0.8 times $T_g$, thus creating a space between the edges of mask zones and the lateral edges of the grid; a deposition of a layer, referred to as an overlayer, made of a material referred to as overlayer material, on the grid and in the space between the edges of mask zones and the lateral edges of the grid; a removal of the masking layer. The invention also relates to the grid thus obtained.

22 Claims, 5 Drawing Sheets

(51) Int. Cl.
*C23C 14/04* (2006.01)
*C23C 16/04* (2006.01)
*C23C 18/06* (2006.01)
*B05D 1/32* (2006.01)

(56) References Cited

U.S. PATENT DOCUMENTS

| | | | |
|---|---|---|---|
| 4,435,047 | A | 3/1984 | Fergason |
| 4,649,432 | A | 3/1987 | Watanabe et al. |
| 4,732,456 | A | 3/1988 | Fergason et al. |
| 4,806,922 | A | 2/1989 | McLaughlin et al. |
| 5,280,373 | A | 1/1994 | Ozawa et al. |
| 5,346,770 | A | 9/1994 | Osada et al. |
| 5,427,983 | A * | 6/1995 | Ahmad et al. ............... 427/96.8 |
| 5,667,853 | A | 9/1997 | Fukuyoshi et al. |
| 5,962,115 | A | 10/1999 | Zmelty et al. |
| 6,014,196 | A | 1/2000 | Anzaki et al. |
| 6,040,056 | A | 3/2000 | Anzaki et al. |
| 6,045,896 | A | 4/2000 | Boire et al. |
| 6,238,741 | B1 * | 5/2001 | Blazick et al. .................. 427/79 |
| 6,414,431 | B1 | 7/2002 | Yu et al. |
| 6,489,045 | B1 | 12/2002 | Araki et al. |
| 6,821,561 | B2 * | 11/2004 | Villarreal et al. .......... 427/248.1 |
| 7,049,757 | B2 | 5/2006 | Foust et al. |
| 7,161,171 | B2 | 1/2007 | Dahmani et al. |
| 7,172,822 | B2 | 2/2007 | Shibata |
| 7,670,652 | B2 * | 3/2010 | Sasaki ........................... 427/468 |
| 8,507,031 | B2 * | 8/2013 | Martin et al. ................... 427/79 |
| 2002/0008286 | A1 | 1/2002 | Yamazaki et al. |
| 2003/0049464 | A1 | 3/2003 | Glenn et al. |
| 2003/0162333 | A1 | 8/2003 | Kim et al. |
| 2003/0186064 | A1 | 10/2003 | Murata et al. |
| 2004/0001915 | A1 | 1/2004 | He et al. |
| 2004/0031957 | A1 | 2/2004 | Tyan |
| 2004/0032220 | A1 | 2/2004 | Cok et al. |
| 2004/0081855 | A1 | 4/2004 | Kim et al. |
| 2004/0113146 | A1 | 6/2004 | Dahmani et al. |
| 2004/0149984 | A1 | 8/2004 | Tyan et al. |
| 2004/0245918 | A1 | 12/2004 | Lee |
| 2005/0000564 | A1 | 1/2005 | Sato et al. |
| 2005/0034810 | A1 * | 2/2005 | Yamazaki et al. ......... 156/345.3 |
| 2005/0073228 | A1 | 4/2005 | Tyan et al. |
| 2005/0073251 | A1 | 4/2005 | Kato |
| 2005/0079418 | A1 * | 4/2005 | Kelley et al. ............. 429/231.95 |
| 2005/0124257 | A1 | 6/2005 | Maeuser |
| 2005/0162071 | A1 | 7/2005 | Lee et al. |
| 2005/0199904 | A1 | 9/2005 | Yamamoto |
| 2005/0264185 | A1 | 12/2005 | Hoffmann |
| 2006/0043886 | A1 | 3/2006 | Lee et al. |
| 2006/0091791 | A1 | 5/2006 | Shin |
| 2006/0124933 | A1 | 6/2006 | Kang |
| 2006/0152833 | A1 | 7/2006 | Halls et al. |
| 2006/0209551 | A1 | 9/2006 | Schwenke et al. |
| 2006/0258809 | A1 * | 11/2006 | Sugeta et al. .................. 525/206 |
| 2006/0269786 | A1 | 11/2006 | Shin et al. |
| 2006/0290841 | A1 | 12/2006 | Kwon et al. |
| 2007/0206263 | A1 | 9/2007 | Neuman et al. |
| 2008/0100202 | A1 | 5/2008 | Cok |
| 2010/0072884 | A1 | 3/2010 | Tchakarov et al. |
| 2010/0117523 | A1 | 5/2010 | Tchakarov |
| 2010/0225227 | A1 | 9/2010 | Tchakarov et al. |

FOREIGN PATENT DOCUMENTS

| | | |
|---|---|---|
| EP | 0 238 164 | 9/1987 |
| EP | 0 733 931 | 9/1996 |
| EP | 0 747 330 | 12/1996 |
| EP | 0 847 965 | 6/1998 |
| EP | 1 329 307 | 7/2003 |
| EP | 1 396 676 | 3/2004 |
| EP | 1 403 939 | 3/2004 |
| EP | 1 521 305 | 4/2005 |
| EP | 1 553 153 | 7/2005 |
| EP | 1 693 483 | 8/2006 |
| EP | 1 717 876 | 11/2006 |
| FR | 2 844 136 | 3/2004 |
| JP | 04364021 | * 12/1992 |
| JP | 10-100303 | 4/1998 |
| JP | 10-217378 | 8/1998 |
| JP | 11-070610 | 3/1999 |
| JP | 2001-243840 | 9/2001 |
| JP | 2002-015623 | 1/2002 |
| JP | 2002-313139 | 10/2002 |
| JP | 2002-313572 | 10/2002 |
| WO | WO 92/19695 | 11/1992 |
| WO | WO 99/02017 | 1/1999 |
| WO | WO 2004/015739 | 2/2004 |
| WO | WO 2004/057674 | 7/2004 |
| WO | WO 2005/041620 | 5/2005 |
| WO | WO 2005/053053 | 6/2005 |
| WO | WO 2006/013373 | 2/2006 |
| WO | WO 2006/090086 | 8/2006 |
| WO | WO 2007/023237 | 3/2007 |
| WO | WO 2007/042689 | 4/2007 |
| WO | WO 2007/096565 | 8/2007 |
| WO | WO 2008/023124 | 2/2008 |

OTHER PUBLICATIONS

International Search Report as issued for PCT/FR2009/051822, dated Feb. 18, 2010.

Adelung, et al., "Strain-controlled growth of nanowires within thin-film cracks", Nature Materials, Nature Publishing Group, vol. 3, Jun. 2004, pp. 375-379.

Kloeppel, A., et al., "Dependence of the electrical and optical behaviour of ITO-silver-ITO multilayers on the silver properties", Thin Solid Films, Elsevier, vol. 365, No. 1, pp. 139-146, Apr. 1, 2000.

Jung, Yeon Sik, et al., "Effects of thermal treatment on the electrical and optical properties of silver-based indium tin oxide / metal / indium tin oxide structures", Thin Solid Films, Elsevier, vol. 440, No. 1-2, pp. 278-284, Sep. 1, 2003.

* cited by examiner

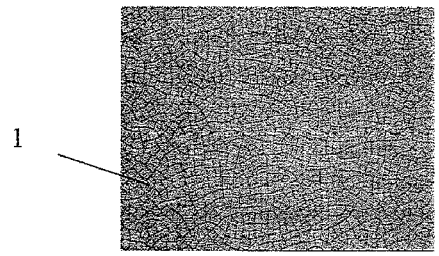
Figure 6
Figure 7
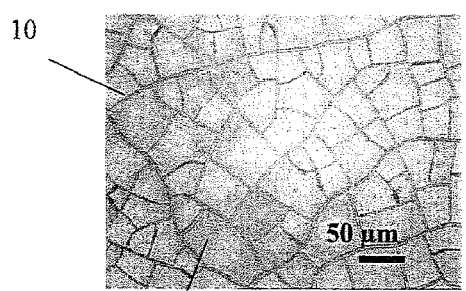 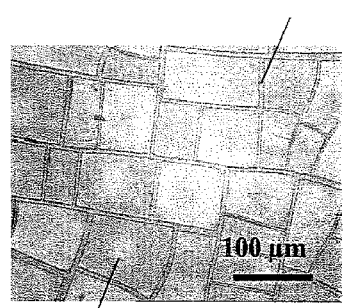
Figure 8a    Figure 8b

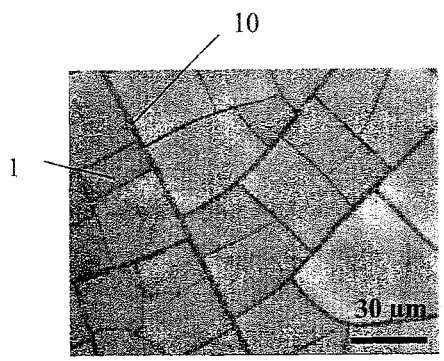
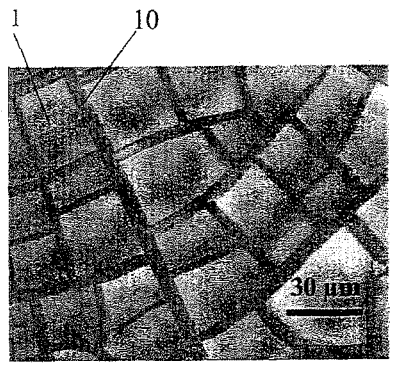
Figure 12a　　　　　　　　　Figure 12b
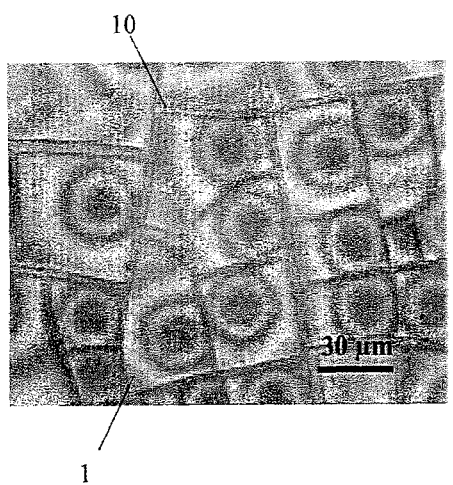
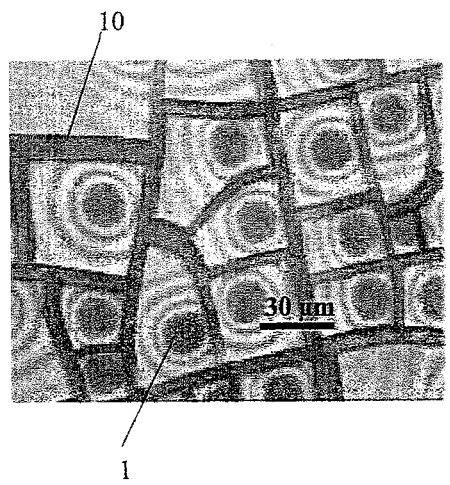
Figure 13a　　　　　　　　　Figure 13b

METHOD FOR MANUFACTURING A SUBMILLIMETRIC ELECTRICALLY CONDUCTIVE GRID COATED WITH AN OVERGRID

CROSS-REFERENCE TO RELATED APPLICATIONS

This application is the U.S. National Stage of PCT/FR2009/051822, filed Sep. 25, 2009, which in turn claims priority to French Application No. 0856448, filed Sep. 25, 2008. The content of both applications are incorporated herein by reference in their entirety.

The present invention relates to a process for producing a submillimetric electroconductive grid coated with an overgrid and to such a grid coated with an overgrid.

Manufacturing techniques are known that make it possible to obtain micron-size metal grids. These have the advantage of attaining surface resistances of less than 1 ohm/square while retaining a light transmission ($T_L$) of around 75 to 85%. The process for producing these grids is based on a technique of etching a metal layer either by a photolithographic process combined with a process for chemical attack via a liquid route, or by a laser ablation technique.

Moreover, self-supported electroconductive grids based on the weaving of metal or metal-covered polymer wires are known, which are used for electromagnetic shielding. These grids have strands that have a dimension of at least 20 μm. These grids are not very strong mechanically, with flatness defects, and require a controlled tension during the weaving and the implementation, or else there is a risk of numerous defects, deformation of the meshes, tearing, unraveling, etc.

Moreover, in certain applications it is sought to coat the submillimetric electroconductive grid.

For example, for esthetic reasons, in motor vehicle windshields, the heating grid made of woven tungsten or copper wires is darkened with graphite. The metal wires are darkened (coating with a suspension of graphite) before the weaving or knitting of the grid.

The present invention therefore aims to overcome the drawbacks of the prior art processes by proposing a process for manufacturing a coated electroconductive submillimetric grid that is economical, rapid and/or simplified (limited number of manufacturing steps, etc.), reproducible.

The aim of the invention is also to broaden the available product ranges based on an electroconductive grid, in particular by making new functionalities possible.

The optical properties and/or the electrical conductive properties of this grid are at least comparable to those of the prior art.

For this purpose, a first subject of the invention is a process for manufacturing a submillimetric electroconductive grid, in particular a submicron-sized (at least for the grid width) grid, coated with an overgrid, on a main face of a substrate, in particular a flat and/or transparent substrate, comprising:
  producing a mask having submillimetric openings, referred to as a network mask, on the main face, including:
    the deposition of a masking layer from a solution of colloidal polymeric nanoparticles that are stabilized and dispersed in a solvent, the polymeric particles having a given glass transition temperature $T_g$;
    the drying of the masking layer at a temperature below said temperature $T_g$ until the mask having a network of openings with substantially straight edges of mask zones is obtained;
  the formation of the electroconductive grid from the network mask, comprising a deposition of at least one electroconductive material, referred to as grid material, until a fraction of the depth of the openings is filled;
  a heat treatment (which may or may not be local) of the masking layer with the grid material at a temperature greater than or equal to 0.8 times $T_g$, in particular between $T_g$ and 1.5 times $T_g$, resulting in a shrinkage of the mask zones, thus creating a space between the edges of mask zones and the lateral edges of the grid;
    a deposition of a layer, referred to as an overlayer, made of a material referred to as overlayer material, on the grid and in the space between the edges of mask zones and the lateral edges of the grid;
  a removal of the masking layer, until the electro-conductive grid coated with the overgrid is revealed.

The mask having a network of openings according to the invention and its method of manufacture according to the invention have a certain number of advantages for the envisaged grid. The advantages associated with the addition of a heat treatment and of an overgrid will be explained hereinbelow.

The mask thus has a random aperiodic structure along at least one characteristic direction of the network (therefore parallel to the surface of the substrate), or even along two (all) directions. The arrangement of the strands of the grid may then be substantially the replica of that of the network of openings.

The edges of the network mask zones are substantially straight, that is to say along a midplane between 80 and 100° relative to the surface (if the surface is curved, relative to the tangential plane), or even between 85° and 95°.

Owing to the straight edges of the mask zones (both before and after the heat treatment):
  the layer deposited that forms the grid is discontinuous (no or little deposition along the edges);
  the layer deposited that forms the overgrid is discontinuous (no or little deposition along the edges).

It is thus possible to remove the mask (even coated with the grid and the overgrid) without damaging the overgrid and the covered grid.

In order to obtain the substantially straight edges, it is necessary to both:
  choose particles of limited size, therefore nanoparticles, in order to promote their dispersion, preferably with at least one characteristic (mean) dimension, for example the mean diameter, of between 10 and 300 nm, or even between 50 and 150 nm; and
  stabilize the nanoparticles in the solvent (especially by treatment via surface charges, for example via a surfactant, by control of the pH), to prevent them from agglomerating together, from precipitating and/or from falling due to gravity.

In addition, the concentration of the nanoparticles is adjusted, preferably between 5%, or even 10% and 60% by weight, more preferably still between 20% and 40%. The addition of a binder is avoided (or in a small enough amount so as not to influence the mask).

Owing to this particular process, it is possible to obtain, at a lower cost, a mask composed of random (shape and/or size), aperiodic patterns of suitable characteristic dimensions:
  (mean) width of the openings of the network A chosen to be micron-sized (in other words the distance between adjacent mask zones), or even nanoscale width A, in particular between a few hundreds of nanometers to a few tens of microns, especially between 200 nm and 50 μm;

(mean) size of a mask zone or pattern B (therefore size between adjacent openings) is millimetric or even submillimetric, especially between 5 and 500 µm, or even from 100 to 250 µm;

B/A ratio is adjustable, in particular, as a function of the nature of the particles, especially between 7 and 20 or even 40;

difference between the maximum width of the openings and the minimum width of the openings is less than 4, or even less than or equal to 2, in a given region of the mask, or even over the majority or the whole of the surface;

difference between the maximum pattern dimension and the minimum pattern dimension is less than 4, or even less than or equal to 2, in a given region of the mask, or even over the majority or even over the whole of the surface;

the amount of open pattern (non-through or "blind" opening), in other words the amount of interconnection rupture, is less than 5%, or even less than or equal to 2%, in a given region of the mask, or even over the majority or the whole of the surface, therefore with limited or even almost zero network rupture, which is optionally reduced and can be eliminated by etching of the network;

for a given pattern, the majority or even all of the patterns, in a given region or over the whole of the surface, the difference between the largest characteristic dimension of the pattern and the smallest characteristic dimension of the pattern is less than 2, in order to strengthen the isotropy; and for the majority or even all of the segments of the network, the edges are constantly spaced, parallel, in particular on a scale of 10 µm (for example, observed with an optical microscope with a magnification of 200).

The width A may be, for example, between 1 and 20 µm, or even between 1 and 10 µm, and B may be between 50 and 200 µm.

Via the process of the invention it is thus possible to form a mesh of openings, which may be spread over the whole surface, making it possible to obtain isotropic properties.

The thickness of the mask may be submicron-sized up to several tens of microns. The thicker the mask layer is, the larger the width A (and B) is.

The patterns delimited by the openings (and therefore the meshes of the grids and/or overgrid) are of diverse shapes, typically with three, four or five sides, for example predominantly with four sides, and/or of diverse sizes, distributed randomly and aperiodically.

For the majority or all of the patterns (respectively the meshes), the angle between two adjacent sides of a mesh may be between 60° and 110°, especially between 80° and 100°.

In one configuration, a main network is obtained with openings (optionally approximately parallel) and a secondary network of openings (optionally approximately perpendicular to the parallel network), the location and the distance of which are random. The secondary openings have a width, for example, smaller than the main openings.

This makes it possible to subsequently produce a grid that is defined by a mean strand width A' that is substantially identical to the width of the openings A and a (mean) space between the strands B' that is substantially identical to the space between the openings B (of a mesh).

In particular, the sizes of the strands A' may preferably be between a few tens of microns and a few hundreds of nanometers. The ratio B'/A' may be chosen between 7 and 20, or even 30 to 40.

Moreover, the characteristic dimensions of the grids of the prior art made by photolithography, generally of regular and periodic shape (square, rectangular), form networks of 20 to 30 µm wide metal strands spaced, for example, 300 µm apart, which are the source, when they are illuminated by a point light source, of diffraction patterns. And it would be even more difficult and expensive to make grids with random patterns. Each pattern to be produced would require a specific mask.

This manufacturing technique of the prior art furthermore has a resolution limit of around a few tens of µm, leaving the patterns esthetically visible.

The weaving of very fine wires itself also has flaws, especially the need for a relatively large diameter of the wires (>40 µm). And the weaving can only produce periodic patterns.

The network mask according to the invention therefore makes it possible to envision, at lower cost, irregular grids of other shapes, of any size. Thus the grid is random in at least one (grid) direction.

Drying causes a contraction of the masking layer and friction of the nanoparticles at the surface resulting in a tensile stress in the layer which, via relaxation, forms the openings.

After drying, a stack of nanoparticles is thus obtained, in the form of clusters of variable size that are separated by the openings that are themselves of variable size. The nanoparticles remain discernible even if they may aggregate together. The nanoparticles are not melted to form a continuous layer.

The drying is carried out at a temperature below the glass transition temperature for the creation of the network of openings. Indeed, it has been observed that above this glass transition temperature a continuous layer, or at the very least a layer without openings running through the entire thickness, was formed.

Thus, a weakly adherent layer simply composed of a stack of (hard), preferably spherical, nanoparticles is deposited on the substrate. These hard nanoparticles do not establish strong chemical bonds, either between themselves or with the surface of the substrate. The cohesion of the layer is provided all the same by weak forces, of the van der Waals forces or electrostatic forces type.

Since the plots are composed of a cluster of nanoparticles: under the action of the temperature during the heat treatment, the mask zones or plots appear to become denser. The size of the plots (B) is decreased: their surface area (and also their thickness) are reduced. Thus there is, via this heat treatment, a modification in the characteristic dimensions of the mask: ratio between the opening of the meshes and the width of the meshes.

Preferably, the heating time is adjusted as a function of the treatment temperature. Typically, the time may be less than 1 h, preferably from 1 min to 30 min.

The compaction of the mask, in addition, gives rise to an improvement of the adhesion of this to the substrate which makes it easier to handle (the chipping thereof is avoided) while retaining the possible removal steps (simple washing with water if the colloid was deposited from an aqueous solution).

The heat treatment may be local or over the entire grid surface.

The zone or zones modified by the heat treatment may be peripheral or central, of any shape.

By heat treatment for compaction of the colloid mask it is therefore possible to modify—locally or over the entire surface—its characteristic dimensions without having to resort to a new mask (case of photolithography or of etching).

It is then possible to locally modify the shape of the meshes (width, height) and to create zones having a conductivity gradient. It is possible to heat locally while keeping the remainder cold.

The B/A ratio may then be different, for example at least double, in a first grid region and in a second grid region. The first and second regions may be of different or equal shape and/or of different or equal size.

With a variable mesh opening/strand size ratio, it is therefore possible to create zones with:
- a light transmission gradient;
- a gradient of electrical power (application to heating, defrosting, producing homogeneous heat flow on non-rectangular surfaces).

In the same way, a deposition of the overgrid may be in all of the heat-treated grid zone or in one or more portions of this zone.

The heat treatment frees sufficient space with the edges of the plots and the lateral edges of the grid so that an additional deposition can cover the grid (preferably entirely) and surround it.

The overgrid may be used to protect a grid that is optionally not very adherent, during the removal of the mask and during subsequent operations.

The grid edges are sloped, due to the straight mask edges and the overgrid deposition method (preferably of PVD type), the overgrid is therefore continuous and completely covers the grid. The thickness of the overgrid is not necessarily constant (for example smaller on the sides of the grid).

Via a technique of photolithography type, it would not be possible to produce such an overgrid in one step. It would be necessary to remake a masking with alignment and then lift-off, which is costly and complex.

The process may in addition comprise the deposition of a layer, referred to as an undergrid, through the openings and under the grid, in particular an undergrid for adhesion of the grid, an undergrid that is a barrier to alkali metals, etc.

Via the process according to invention, techniques of photolithography type, which is particularly complex and expensive when it is a question of etching several layers of material, are dispensed with. This requires finding an etching solution that etches the various stacked materials at the same rate in order to avoid overetching.

As a layer for promoting adhesion of the grid material, in particular metal (silver, gold, copper, etc.), especially onto glass, it is possible to choose a layer based on NiCr, Ti, Nb, Al or a single or mixed, doped or undoped metal oxide (ITO, etc.), the layer for example having a thickness less than or equal to 5 nm.

Examples of barrier materials to alkali metals or darkening materials will be described subsequently.

For the sake of simplicity, techniques for depositing grid material and overgrid material and optional undergrid material that are directional (and preferably identical) may thus be favored. The depositions may be carried out both through openings and on the mask.

In preferred embodiments of the invention, it is possible to optionally resort, in addition, to one and/or the other of the following arrangements:
- the deposition of the grid material fills both a fraction of the mask openings and also covers the surface of the mask;
- the deposition of the grid material is an atmospheric pressure deposition, especially by plasma, a deposition under vacuum, by sputtering or by evaporation;
- the deposition of the overgrid material fills both a fraction of the mask openings (and covers the grid) and also covers the surface of the mask;
- the deposition of the overgrid material is an atmospheric pressure deposition, especially by plasma, a deposition under vacuum, by sputtering or by evaporation;
- the deposition of the undergrid material fills both a fraction of the mask openings and also covers the surface of the mask; and
- the deposition of the undergrid material is an atmospheric pressure deposition, especially by plasma, a deposition under vacuum, by sputtering or by evaporation.

It is thus possible to then choose one or more deposition techniques that can be carried out at ambient temperature and/or that is simple (especially simpler than a catalytic deposition that inevitably requires a catalyst) and/or that give dense deposits.

The methods for depositing the grid layer or overgrid layer or undergrid layer may be of vacuum thermal evaporation type, which is optionally plasma-assisted (technique developed by Fraunhofer of Dresden): they have deposition rates greater than those obtained by magnetron sputtering.

Preferably, the grid deposition, the heat treatment and the overgrid deposition (and preferably the optional undergrid deposition) are carried out in the same deposition chamber (a sputtering or evaporation deposition chamber for example) without breaking the vacuum.

The substrate may be tinted.

The substrate receiving the network mask may be flat or curved.

Its main faces may be rectangular, square or even of any other shape (round, oval, polygonal, etc.). This substrate may be of a large size, for example having a surface area greater than $0.02 \text{ m}^2$, or even $0.5 \text{ m}^2$ or $1 \text{ m}^2$.

The substrate may be substantially transparent, inorganic or made of a plastic such as polycarbonate PC or polymethyl methacrylate PMMA, or else PET, polyvinyl butyral PVB, polyurethane PU, polytetrafluoroethylene PTFE, etc.

The substrate receiving the mask may comprise a continuous sublayer (especially a base layer, closest to the substrate), which is capable of being a barrier to alkali metals.

Such a sublayer protects the grid material from any pollution (pollution which may lead to mechanical defects such as delaminations), in the case of an electroconductive deposition (to form the electrode in particular), and additionally preserves its electrical conductivity.

The base layer is robust, quick and easy to deposit according to various techniques. It can be deposited, for example, by a pyrolysis technique, especially as a vapor phase (technique often denoted by the abbreviation CVD for "chemical vapor deposition"). This technique is advantageous for the invention since suitable adjustments of the deposition parameters make it possible to obtain a very dense layer for a reinforced barrier.

The base layer may optionally be doped with aluminum and/or boron to render its deposition under vacuum more stable. The base layer (a single layer or multilayer, optionally doped) may have a thickness between 10 and 150 nm, more preferably still between 15 and 50 nm.

The base layer may preferably be:
- based on silicon oxide, silicon oxycarbide, a layer of general formula SiOC;
- based on silicon nitride, silicon oxynitride, silicon oxycarbonitride, a layer of general formula SiNOC, especially SiN, in particular $Si_3N_4$.

Very particularly, a base layer (predominantly) made of doped or undoped silicon nitride $Si_3N_4$ may be preferred. Silicon nitride is deposited very rapidly and forms an excellent barrier to alkali metals.

It is possible to clean the network of openings using an atmospheric pressure plasma source.

The process uses a mask manufactured from the drying of a colloidal solution, thus the deposition surface of the mask is necessarily chemically stable with water or other solvents used and in the event of an aqueous solvent, the surface is preferably hydrophilic.

The surface for the deposition of the masking layer is a film-forming surface, in particular preferably a hydrophilic surface if the solvent is aqueous, as already seen. This is the surface:

- of the substrate: glass, plastic (polyurethane or polycarbonate, for example), plastic that is optionally treated (by plasma for example) so as to be hydrophilic, for example a treated PET, a treated PMMA;
- or of an optionally functional added continuous sublayer:
    - hydrophilic layer (silica layer, for example on hydrophobic plastic, such as PET and PMMA), layer for promoting sufficient adhesion of the mask; and/or an alkali-metal barrier layer, as already described;
    - and/or (as last layer) a layer for promoting the adhesion of the grid material,
    - and/or a (transparent) electroconductive layer, and/or a decorative, colored or opaque layer.

Between the mask layer and the substrate there may be several sublayers.

A $T_g$ is chosen that makes it possible to carry out a heat treatment at a temperature of less than or equal to 180° C., more preferably still of less than or equal to 150° C.

Preferably a $T_g$ between 50° C. and 120° C. is chosen.

Drying may result, in one step, in the elimination of the solvent and in the formation of the openings.

The mask obtained is capable of easily being eliminated using cold or warm pure water, in particular with an aqueous solvent, without requiring highly basic solutions or potentially polluting organic compounds.

By choosing a high enough Tg for the nanoparticles of the solution, the drying step (like preferably the step for deposition of the solution) may be carried out (substantially) at a temperature below 50° C., preferably at ambient temperature, typically between 20° and 25° C.

The difference between the given glass transition temperature $T_g$ of the particles of the solution and the drying temperature preferably being greater than 10° C., or even 20° C.

The step of drying the masking layer may be carried out substantially at atmospheric pressure rather than drying under vacuum for example.

It is possible to modify the drying parameters (control parameters), especially the degree of humidity and the drying rate, in order to adjust the distance between the openings B, the size of the openings A, and/or the B/A ratio.

The higher the humidity is (all things otherwise being equal), the lower A is.

The higher the temperature is (all things otherwise being equal), the higher B is.

It is possible to deposit a solution (aqueous or non-aqueous) of colloids via standard liquid techniques.

It is possible to modify other control parameters chosen from the friction coefficient between the compacted colloids, in particular by nanotexturing of the substrate and the surface of the substrate, the size of the nanoparticles and the initial particle concentration, the nature of the solvent and the thickness that is dependent on the deposition technique, in order to adjust B, A and/or the B/A ratio.

The higher the concentration is (all things otherwise being equal), the lower B/A is.

As wet techniques, mention is made of:
- spin coating;
- curtain coating;
- dip coating;
- spray coating; and
- flow coating.

The solution may be naturally stable, with nanoparticles that are already formed, and preferably contains no (or a negligible amount of) reactive element of polymer precursor type.

The solvent is preferably water-based, or even entirely aqueous.

The solution of colloids comprises polymeric nanoparticles (preferably with a solvent that is water-based, or even entirely aqueous).

For example, acrylic copolymers, styrenes, polystyrenes, poly(meth)acrylates, polyesters or mixtures thereof are chosen.

The masking layer (before drying) may thus be essentially composed of a stack of colloidal nano-particles (therefore nanoparticles of a material that is insoluble in the solvent) that are discernible and polymeric.

The polymeric nanoparticles may preferably be composed of a solid, water-insoluble polymer.

The expression "essentially composed" is understood to mean that the masking layer may optionally comprise other compounds, as traces, and which do not have an influence on the properties of the mask (formation of the network, easy removal, etc.).

The colloidal aqueous solution is preferably composed of water and of polymeric colloidal particles, to the exclusion therefore of any other chemical agent (such as, for example, pigments, binders, plasticizers, etc.). Likewise, the colloidal aqueous dispersion is preferably the only compound used to form the mask.

The network mask, after drying, may thus be essentially composed of a stack of nanoparticles, preferably polymeric, discernible nanoparticles. The polymeric nanoparticles are composed of a solid, water-insoluble polymer.

The solution may comprise cumulatively, inorganic nanoparticles, preferably of silica, alumina or iron oxide.

Preferably, the removal of the mask is carried out via a liquid route, by a solvent that is inert for the grid, for example water, acetone or alcohol, (optionally at high temperature and/or assisted by ultrasound).

It is also possible to clean the network of openings prior to the deposition of the grid material being carried out.

The invention also relates to a substrate, in particular that is transparent and bears a grid coated with an overgrid formed from the manufacturing process already defined previously.

The difference between the light transmission of the substrate with the grid and that of the substrate with the coated grid is preferably less than or equal to 25%, more preferably still less than or equal to 10%.

The overgrid comprises a corrosion-protective layer that covers and surrounds the grid, in particular for a metal (silver, aluminum, copper, etc.) overgrid.

As overlayer material(s), it is possible to choose:
- silicon nitride, silica (that does not modify the light transmission);
- carbonitrides;
- a metal less oxidizable than the grid material, for example for aluminum a choice of: Cr, Mo, NiCr.

By way of illustration, for sufficient corrosion protection the following are chosen:
- an overgrid thickness greater than or equal to 10 nm, preferably less than half of the grid thickness, less than or equal to 100 nm;
- a width of the overgrid starting from the grid edge of greater than or equal to A'/2, and less than or equal to 3A', preferably less than or equal to 2A'.

Preferably, a corrosion-protective sublayer, made of overgrid material, is added preferably having a thickness less than or equal to 50 nm.

The encapsulation is thus complete.

The overgrid may comprise a darkening layer, with a purity in reflection Pe of less than 10% and a dominant wavelength in reflection around the blue spectrum (around 480 nm).

This may in particular be used for darkening copper, having a dominant wavelength of reflection around the red spectrum (around 600 nm).

As overlayer material(s), Cr, NiCr may be chosen.

This reduction of the light reflection (passing from the red to the blue spectrum) improves the esthetics.

By way of illustration, for sufficient darkening the following are chosen:
- an overgrid thickness of greater than or equal to 20 nm, preferably less than half the thickness of the grid;
- a width of the overgrid starting from the grid edge of greater than or equal to A'/2, and less than or equal to 2A', preferably less than or equal to 1.5A'.

Preferably, a darkening sublayer, in particular made of overgrid material is added, preferably having a thickness less than or equal to 50 nm.

By observing the grid in the grazing incidence, the grid appears black over all the faces.

The overgrid material may also be made of said grid material. The strand is thus thicker at the center than at the edges. This also makes it possible to increase the electrical conductivity.

The overgrid may enable compatibility with the subsequent steps for manufacturing a product.

For example, an overgrid may be a grid metal diffusion barrier layer, for example a barrier layer made of aluminum or molybdenum, on a copper grid. The copper pollutes any organic layer, for example that (those) of an OLED device.

For example, an overgrid may be made of an oxide (metal oxide, etc.), in order to facilitate the lamination of an oxidizable metal grid (copper, etc.) having insufficient compatibility with the interlayer (PVB in particular).

For example, the overgrid may comprise an etch-stop layer, which is insulating or conductive if necessary.

The grid may be deposited on a sublayer, for example a hydrophilic and/or adhesion-promoting and/or barrier and/or decorative sublayer as already indicated.

The grid (and its overgrid, its undergrid) may be irregular, that is to say a two-dimensional meshed network of strands with random, aperiodic meshes (closed patterns delimited by the strands).

The grid (or its overgrid) may have one or more of the following characteristics:
- a ratio of the (mean) space between the strands (B') to the submillimetric (mean) width of the strands (A') of between 7 and 40;
- the grid patterns are random (aperiodic) and of diverse shape and/or size;
- the meshes have three and/or four and/or five sides, for example mostly four sides;
- the grid has an aperiodic (or random) structure in at least one direction, preferably in two directions;
- for most, or even all, of the meshes in a given region or over the entire surface, the difference between the largest characteristic dimension of the mesh and the smallest characteristic dimension of the mesh is less than 2;
- for most, or even all, of the meshes, the angle between two adjacent sides of one mesh may be between 60° and 110°, especially between 80° and 100°;
- the difference between the maximum width of the strands and the minimum width of the strands is less than 4, or even less than or equal to 2, in a given grid region, or even over the majority or all of the surface;
- the amount of non-sealed mesh and/or of cut ("blind") strand segment is less than 5%, or even less than or equal to 2%, in a given grid region, or even over the majority or the whole of the surface, i.e. a limited or even almost zero network rupture;
- the difference between the maximum mesh dimension (space between strands forming a mesh) and the minimum mesh dimension is less than 4, or even less than or equal to 2, in a given grid region, or even over the majority or all of the surface;
- for the most part, the strand edges are constantly spaced, in particular substantially linear, parallel, on a scale of 10 μm (for example observed with an optical microscope with a magnification of 200).

The grid according to the invention may have isotropic electrical properties.

The irregular grid according to the invention may not diffract a point light source.

The thickness of the strands of the grid may be substantially constant in thickness or may be wider at the base.

The grid (and its overgrid) may comprise a main network with strands (optionally that are approximately parallel) and a secondary network of strands (optionally that are approximately perpendicular to the parallel network).

The grid may be deposited onto at least one portion of the surface of the substrate, in particular a substrate having a glass function, made of plastic or inorganic material, as already indicated.

The electroconductive grid (or its overgrid) may have a sheet resistance between 0.1 and 30 ohm/square. Advantageously, the electroconductive grid according to the invention may have a sheet resistance less than or equal to 5 ohm/square, or even less than or equal to 1 ohm/square, or even 0.5 ohm/square, especially for a grid thickness greater than or equal to 1 μm, and preferably less than 10 μm or even less than or equal to 5 μm.

The B'/A' ratio may be different, for example at least double, in a first grid region and in a second grid region. The first and second regions may be of different or equal shape and/or of different or equal size.

With a variable mesh opening/strand size ratio, it is therefore possible to create zones with:
- a light transmission gradient; and
- an electrical power gradient (application to heating, defrosting, producing homogeneous heat flow over non-rectangular surfaces).

The light transmission of the grid (and its overgrid) depends on the B/A ratio of the mean distance between the strands B to the mean width of the strands A.

Preferably, the B/A ratio is between 5 and 15, more preferably still around 10, to easily retain the transparency and facilitate the manufacture. For example, B and A are respectively equal to around 50 μm and 5 μm.

In particular, a mean strand width A is chosen between 100 nm and 30 μm, preferably less than or equal to 10 μm, or even 5 μm in order to limit their visibility, and greater than or equal to 1 μm to facilitate the manufacture and to easily retain a high conductivity and a transparency.

In particular, it is additionally possible to choose a mean distance between strands B' that is greater than A', between 5 μm and 300 μm, or even between 20 and 100 μm, to easily retain the transparency.

The thickness of the strands may be between 100 nm and 5 μm, especially micron-sized, more preferably still from 0.5 to 3 μm to easily retain a transparency and a high conductivity.

The grid according to the invention may be over a large surface area, for example a surface area greater than or equal to 0.02 m$^2$, or even greater than or equal to 0.5 m$^2$ or to 1 m$^2$.

By varying the B'/A' ratio (space between the strands B' over the width of the strands A' size of the strands), haze values between 1 and 20% are obtained for the grid.

The substrate may be substantially transparent, as already seen. The substrate may have a glass function when it is substantially transparent, and when it is based on inorganic materials (for example, a soda-lime-silica glass) or when it is based on a plastic (such as polycarbonate PC or on polymethyl methacrylate PMMA).

In order to transmit UV radiation, the substrate may preferably be chosen from quartz, silica, magnesium fluoride ($MgF_2$) or calcium fluoride ($CaF_2$), a borosilicate glass or a glass with less than 0.05% $Fe_2O_3$.

To give examples, for thicknesses of 3 mm:
  magnesium or calcium fluorides transmit more than 80%, or even 90%, over the entire range of UV bands, that is to say UVA (between 315 and 380 nm), UVB (between about 280 and 315 nm), UVC (between 200 and 280 nm) and VUV (between about 10 and 200 nm);
  quartz and certain high-purity silicas transmit more than 80%, or even 90%, over the entire range of UVA, UVB and UVC bands;
  borosilicate glass, such as Borofloat® from Schott, transmits more than 70% over the entire UVA band; and
  soda-lime-silica glass with less than 0.05% Fe(III) or $Fe_2O_3$, especially the glass Diamant® from Saint-Gobain, the glass Optiwhite® from Pilkington, and the glass B270 from Schott, transmit more than 70% or even 80% over the entire UVA band.

However, a soda-lime-silica glass, such as the glass Planilux® sold by Saint-Gobain, has a transmission of more than 80% above 360 nm, which may be sufficient for certain constructions and certain applications.

The substrate may also be chosen for being transparent in a given infrared band, for example between 1 μm and 5 μm. For example, it may be sapphire.

The (overall) light transmission of the substrate bearing the coated grid may be greater than or equal to 50%, more preferably still greater than or equal to 70%, especially is between 70% and 86%.

The (overall) transmission, in a given IR band, for example between 1 μm and 5 μm, of the substrate bearing the coated grid may be greater than or equal to 50%, more preferably still greater than or equal to 70%, especially is between 70% and 86%. The targeted applications are heated glazing units with infrared vision systems, in particular for night vision.

The (overall) transmission, in a given UV band, of the substrate bearing the coated grid may be greater than or equal to 50%, more preferably still greater than or equal to 70%, especially is between 70% and 86%.

A multiple, laminated glazing unit (lamination interlayer of EVA, PU, PVB, etc. type) may incorporate the substrate with the coated grid according to the invention.

The coated grid according to the invention may be used, in particular, as a lower electrode (closest to the substrate) for an organic light-emitting device (OLED), especially a bottom emission OLED or a bottom and top emission OLED.

According to yet another aspect of the invention, it targets the use of a grid such as described previously as:
  an active layer (single-layer or multilayer electrode) in an electrochemical and/or electrically controllable device having variable optical and/or energy properties, for example a liquid crystal device or a photovoltaic device, or else an organic or inorganic light-emitting device (TFEL, etc.), a lamp especially a flat lamp or an optionally flat UV lamp;
  a heating grid of a heating device, for a vehicle (heated windshield, heated rear window) or for electrical goods applications of the radiator, towel warmer or refrigerated cabinet type, for a defrosting, anti-condensation or anti-fogging action, etc.;
  an electromagnetic shielding grid;
  or any other device requiring an (optionally (semi)-transparent) electroconductive grid.

As a reminder, in electrochromic systems, there are "all solid" electrochromic systems (the term "all solid" being defined, within the context of the invention, in respect of the multilayer stacks for which all the layers are of inorganic nature) or "all polymer" electrochromic systems (the term "all polymer" being defined, within the context of the invention, in respect of the multilayer stacks for which all the layers are of organic nature), or else mixed or hybrid electrochromic systems (in which the layers of the stack are of organic nature and inorganic nature) or else liquid-crystal or viologen systems.

As a reminder, discharge lamps comprise with phosphor(s) as active element. Flat lamps in particular comprise two glass substrates held slightly apart, generally separated by less than a few millimeters, and hermetically sealed so as to contain a gas under reduced pressure, in which an electrical discharge produces radiation generally in the ultraviolet range, which excites a phosphor, which then emits visible light.

Flat UV lamps may have the same structure, naturally for at least one of the walls a material is chosen that transmits UV (as already described). The UV radiation is directly produced by the plasma gas and/or by a suitable additional phosphor.

As examples of flat UV lamps, reference may be made to patents WO 2006/090086, WO 2007/042689, WO 2007/023237 and WO 2008/023124 which are incorporated by reference.

The discharge between the electrodes (anode and cathode) may be non-coplanar ("plane-plane"), with anode and cathode respectively associated with the substrates, via a face or in the thickness, (both internal or external, one internal and the other external, at least one in the substrate, etc.), for example as described in patents WO 2004/015739, WO 2006/090086 or WO 2008/023124 which are incorporated by reference.

In UV lamps and flat lamps, the discharge between the electrodes (anode and cathode) may be coplanar (anode and cathode in one and the same plane, on one and the same substrate) as described in patent WO 2007/023237 which is incorporated by reference.

It may be another type of lighting system, namely an inorganic light-emitting device, the active element being an inorganic light-emitting layer based on a doped phosphor, for example chosen from: ZnS:Cu,Cl; ZnS:Cu,Al; ZnS:Cu,Cl, Mn or else CaS or SrS. This layer is preferably separated from the electrodes by insulating layers. Examples of such glazing are described in document EP 1 553 153 A (with the materials, for example, in table 6).

Liquid crystal glazing may be used as variable light scattering glazing. It is based on the use of a film based on a polymer material and placed between two conductive layers, droplets of liquid crystals, especially nematic liquid crystals having positive dielectric anisotropy, being dispersed in said material. When a voltage is applied to the film, the liquid crystals orient in a preferred direction, thereby allowing vision. With no voltage applied, the crystals not being aligned, the film becomes diffusing and prevents vision. Examples of such films are described, in particular, in European patent EP 0 238 164 and U.S. Pat. No. 4,435,047, U.S. Pat. No. 4,806,922 and U.S. Pat. No. 4,732,456. This type of film, once laminated and incorporated between two glass substrates, is sold by SAINT-GOBAIN GLASS under the brand name Privalite.

In fact, it is possible to use any element based on liquid crystals known under the terms "NCAP" (nematic curvilinearly aligned phases) or "PDLC" (polymer dispersed liquid crystal) or "CLC" (cholesteric liquid crystal).

The latter may also contain dichroic dyes, in particular in solution in the droplets of liquid crystals. It is then possible to jointly modulate the light scattering and the light absorption of the systems.

It is also possible to use, for example, gels based on cholesteric liquid crystals containing a small amount of crosslinked polymer, such as those described in patent WO 92/19695.

The invention also relates to the incorporation of a grid such as obtained from the production of the mask described previously in glazing, operating in transmission.

The term "glazing" should be understood in the broad sense and encompasses any essentially transparent material, having a glass function, that is made of glass and/or of a polymer material (such as polycarbonate PC or polymethyl methacrylate PMMA). The carrier substrates and/or counter-substrates, that is to say the substrates flanking the active system, may be rigid, flexible or semi-flexible.

The invention also relates to the various applications that may be found for these devices, mainly as glazing or mirrors: they may be used for producing architectural glazing, especially exterior glazing, internal partitions or glazed doors. They may also be used for windows, roofs or internal partitions of modes of transport such as trains, planes, cars, boats and worksite vehicles. They may also be used for display screens such as projection screens, television or computer screens, touch-sensitive screens, illuminating surfaces and heated glazing.

The invention will now be described in greater detail with the aid of non-limiting examples and figures:

FIGS. 1 and 2 schematically represent the main steps of the process for manufacturing the submillimetric electroconductive grid coated with an overgrid according to the invention;

FIGS. 3 to 5 schematically represent the main steps of the process for manufacturing the coated grid according to the invention, in one variant;

FIGS. 6 to 8b represent examples of masks used in the process according to the invention;

FIGS. 12a to 13b illustrate the influence of heat treatment on the network mask.

Figure 1:
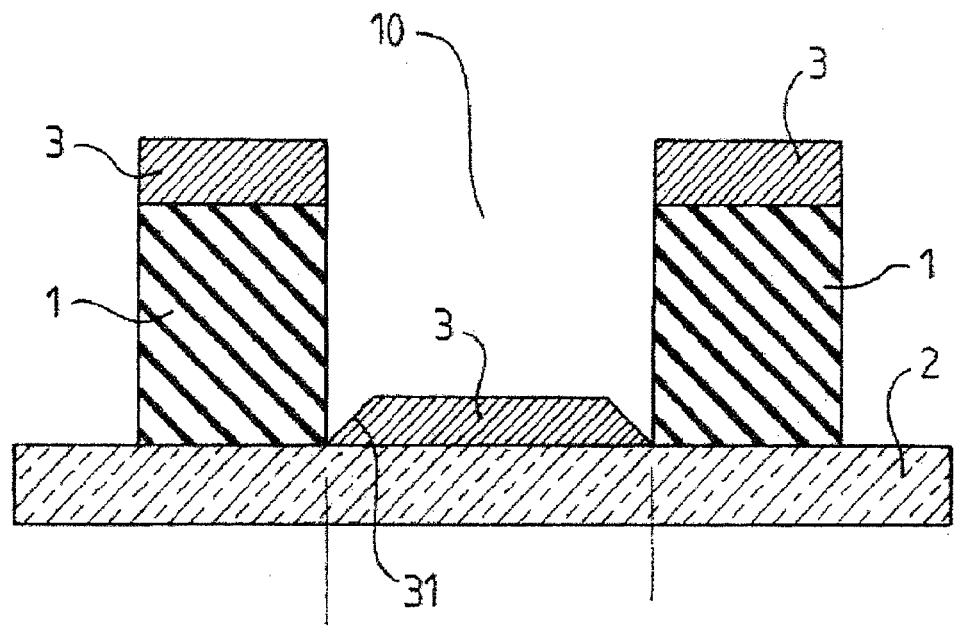
Figure 2:
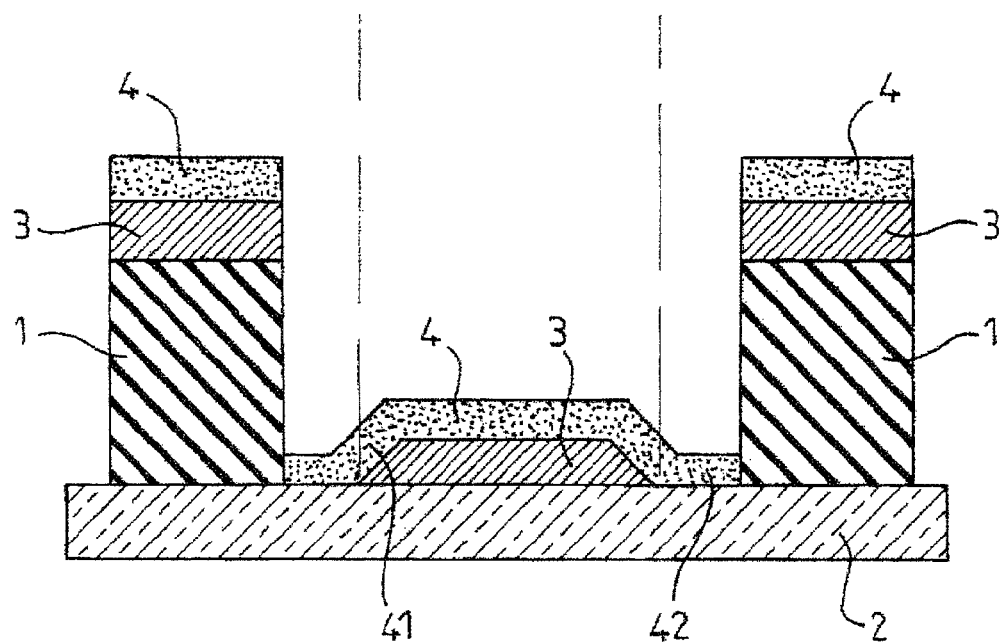

FIGS. 1 and 2 schematically represent the main steps of the process for manufacturing the submillimetric electroconductive grid coated with an overgrid according to the invention.

The process for manufacturing the coated grid comprises:
producing a mask 1 having submillimetric openings, referred to as a network mask, on the main face of a substrate 2, including:
the deposition of a masking layer from a solution of colloidal polymeric nanoparticles that are stabilized and dispersed in a solvent, the polymeric particles having a given glass transition temperature $T_g$;
the drying of the masking layer at a temperature below said temperature $T_g$ until the mask 1 having a network of openings 10 with substantially straight edges of mask zones is obtained, the openings separating the mask zones;
the formation of the electroconductive grid 3 from the network mask comprising a deposition, by PVD, of at least one electroconductive material, referred to as grid 3 material, until a fraction of the depth of the openings is filled, and also covering the surface of the mask zone;
a heat treatment of the masking layer with the grid material at a temperature greater than or equal to 0.8 times $T_g$, resulting in a shrinkage of the mask zones, thus creating a space between the edges of mask zones and the lateral edges of the grid;
a deposition of a layer, referred to as an overlayer, made of a material referred to as overlayer 4 material, on the grid and in the space between the edges of mask zones and the lateral edges of the grid, and also covering the surface of the mask zones; and
a removal of the masking layer, until the grid coated with the overgrid is revealed.

As the edges of the mask zones are straight, the layer forming the grid 3 has sloped lateral edges 31 as shown in FIG. 1.

Since the edges of the mask zones are further apart after the heat treatment, the layer forming the overgrid 4 covers the sloped lateral edges 31 (with matching lateral edges that are also sloped 41) and extends to the mask zone edges as shown in FIG. 2.

This overgrid covering three faces of the grid 3 may act as a layer for protection against corrosion, for protection of the grid in view of difficult process steps, or for darkening.

Figure 3:
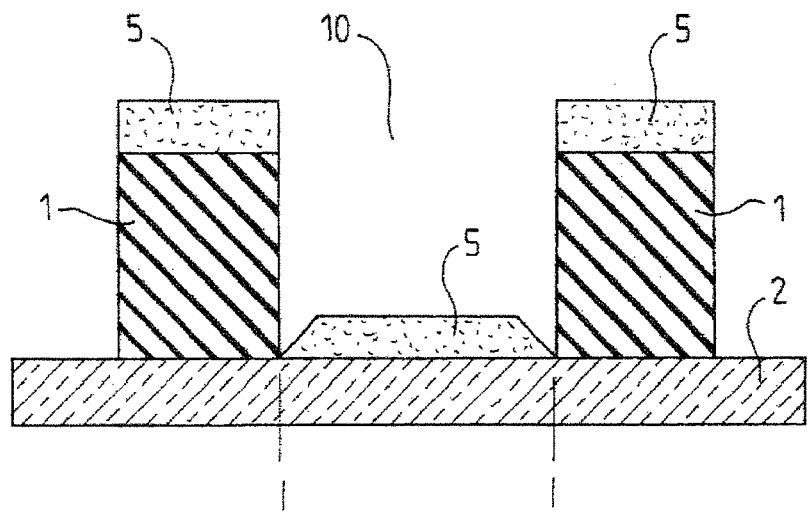
Figure 4:
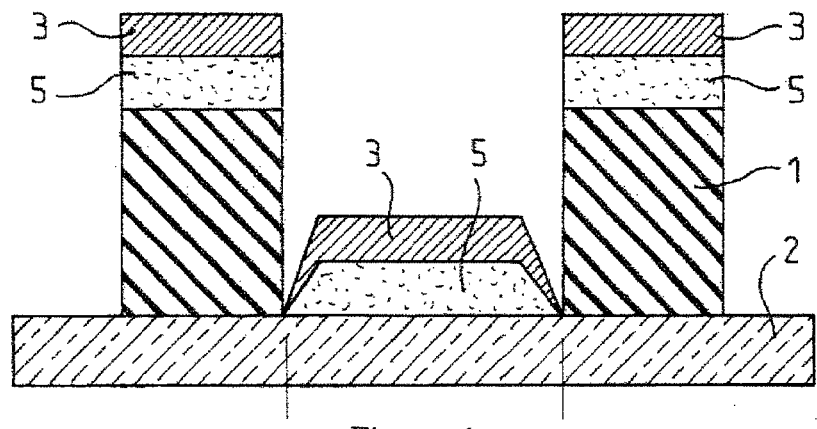
Figure 5:
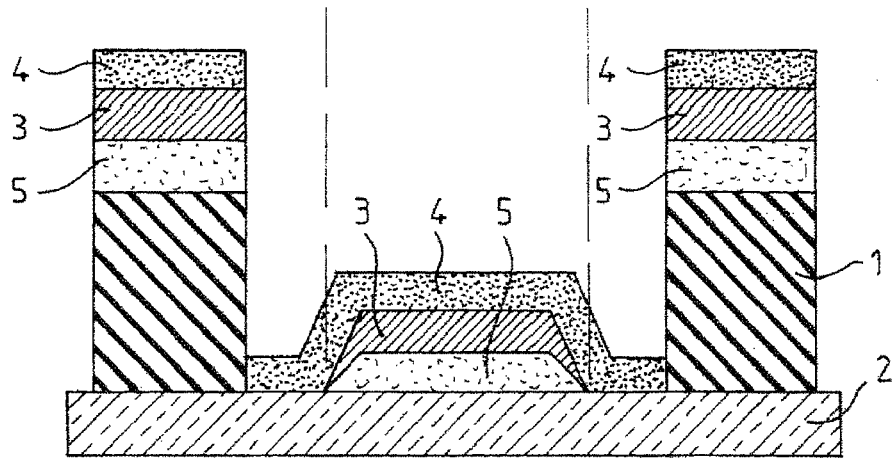

FIGS. 3 to 5 schematically represent the main steps of the process for manufacturing the submillimetric electroconductive grid coated with an overgrid according to the invention, in one variant.

In this variant, the process differs in that it comprises the deposition of a layer, referred to as an undergrid 5, through the openings 10 and under the grid 4, (and also covering the surface of the mask zones), in particular an undergrid for adhesion of the grid, an undergrid that is a barrier to alkali metals or a darkening undergrid.

The undergrid and the overgrid covering the four faces of the grid 3 as in FIG. 5.

The main manufacturing steps will now be explained in detail, one by one, in successive order.

Manufacture of the Network Mask

A simple emulsion of colloidal particles based on an acrylic copolymer that are stabilized in water at a concentration of 40 wt %, a pH of 5.1 and with a viscosity equal to 15 mPa·s are deposited by a wet route technique, by spin coating, onto a portion of a substrate having a glass function, for example which is flat and inorganic. The colloidal particles have a characteristic dimension between 80 and 100 nm and are sold by DSM under the trademark NEOCRYL XK 52® and have a $T_g$ equal to 115° C.

Drying of the layer incorporating the colloidal particles is then carried out so as to evaporate the solvent and form the openings. This drying may be carried out by any suitable process and at a temperature below the $T_g$ (hot air drying, etc.), for example at ambient temperature.

During this drying step, the system rearranges itself and forms a network mask 1 comprising a network of openings and mask zones. It depicts patterns, exemplary embodiments of which are represented in FIGS. 6 and 7 (400 µm×500 µm views).

A stable network mask 1 is obtained without resorting to annealing, having a structure characterized by the (mean) width of the opening subsequently referred to as A and the (mean) space between the openings subsequently referred to as B. This stabilized network mask will subsequently be defined by the ratio B/A.

A two-dimensional meshed network of openings, with little rupture of the meshes (blocked opening), is obtained.

The influence of the drying temperature was evaluated. Drying at 10° C. under 20% RH results in an 80 µm mesh (FIG. 8a), whereas drying at 30° C. under 20% RH results in a 130 µm mesh (FIG. 8b).

The influence of the drying conditions, especially the degree of humidity, was evaluated. The layer based on XK52 is this time deposited by flow coating which gives a variation in thickness between the bottom and the top of the sample (from 10 µm to 20 µm) resulting in a variation of the mesh size. The higher the humidity is, the smaller B is.

| Drying | Position | Mesh size B (µm) |
| --- | --- | --- |
| 10° C. - 20% humidity | top | 65 |
| 10° C. - 20% humidity | bottom | 80 |
| 10° C. - 80% humidity | top | 45 |
| 10° C. - 80% humidity | bottom | 30 |
| 30° C. - 20% humidity | top | 60 |
| 30° C. - 20% humidity | bottom | 130 |
| 30° C. - 80% humidity | top | 20 |
| 30° C. - 80% humidity | bottom | 45 |

This B/A ratio is also modified by adjusting, for example, the friction coefficient between the compacted colloids and the surface of the substrate, or else the size of the nanoparticles, or even also the evaporation rate, or the initial particle concentration, or the nature of the solvent, or the thickness that is dependent on the deposition technique.

In order to illustrate these various possibilities, an experimental design is given below with 2 concentrations of the colloid solution ($C_0$ and $0.5 \times C_0$) and various thicknesses deposited by adjusting the ascent rate of the dip coater. It is observed that it is possible to change the B/A ratio by changing the concentration and/or the drying rate. The results are given in the following table:

| Weight concentration | Ascent rate of the dip coater (cm/min) | B: space between the openings (µm) | A: width of the openings (µm) | B/A ratio |
| --- | --- | --- | --- | --- |
| 20% | 5 | 25 | 3 | 8.4 |
| 20% | 10 | 7 | 1 | 7 |
| 20% | 30 | 8 | 1 | 8 |
| 20% | 60 | 13 | 1.5 | 8.6 |
| 40% | 5 | 50 | 4 | 12.5 |
| 40% | 10 | 40 | 3.5 | 11.4 |
| 40% | 30 | 22 | 2 | 11 |
| 40% | 60 | 25 | 2.2 | 11.4 |

The colloid solution was deposited at the concentration of $C_0=40\%$ by using film-drawers of various thicknesses. These experiments show that the size of the strands and the distance between the strands can be varied by adjusting the initial thickness of the colloid layer.

| Thickness deposited by the film-drawer (µm) | Weight % | B: space between the openings (µm) | A: width of the openings (µm) | B/A ratio |
| --- | --- | --- | --- | --- |
| 30 | 40 | 20 | 2 | 10 |
| 60 | 40 | 55 | 5 | 11 |
| 90 | 40 | 80 | 7 | 11.4 |
| 120 | 40 | 110 | 10 | 11.1 |
| 180 | 40 | 200 | 18 | 11.1 |
| 250 | 40 | 350 | 30 | 11.6 |

Finally, the surface roughness of the substrate was modified by etching, with atmospheric plasma, the surface of the glass via a mask of Ag nodules. This roughness was of the order of magnitude of the size of the contact zones with the colloids which increases the friction coefficient of these colloids with the substrate. The following table shows the effect of changing the friction coefficient on the B/A ratio and the morphology of the mask. It appears that smaller mesh sizes at an identical initial thickness and a B/A ratio which increases are obtained.

| Nanotexturing treatment | Ascent rate of the dip coater (cm/min) | B: space between the openings (µm) | A: width of the openings (µm) | B/A ratio |
| --- | --- | --- | --- | --- |
| Yes | 5 | 38 | 2 | 19 |
| Yes | 10 | 30 | 1.75 | 17.2 |
| Yes | 30 | 17 | 1 | 17 |
| Yes | 60 | 19 | 1 | 17.4 |
| Reference | 5 | 50 | 4 | 12.5 |
| Reference | 10 | 40 | 3.5 | 11.4 |
| Reference | 30 | 22 | 2 | 11 |
| Reference | 60 | 25 | 2.2 | 11.4 |

In another exemplary embodiment, the dimensional parameters of the network of openings obtained by spin coating of one and the same emulsion containing the colloidal particles described previously are given below. The various rotational speeds of the spin-coating device modify the structure of the mask.

| Rotational speed (rpm) | B: space between the openings (µm) | A: width of the openings (µm) | B/A ratio |
| --- | --- | --- | --- |
| 200 | 40 | 2 | 20 |
| 400 | 30 | 2 | 15 |
| 700 | 20 | 1 | 20 |
| 1000 | 10 | 0.5 | 20 |

Figure 10:
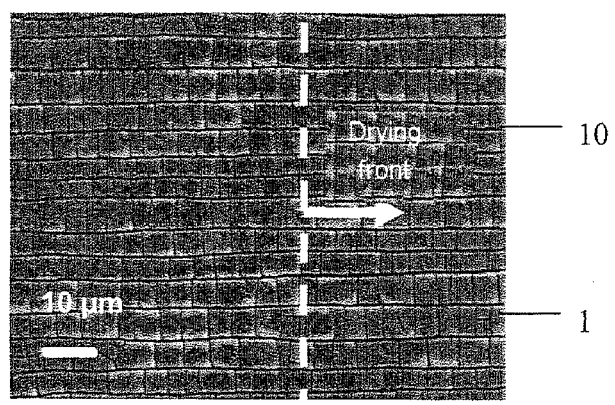
FIGS. 10 and 11 represent network masks with different drying fronts.
Figure 11:
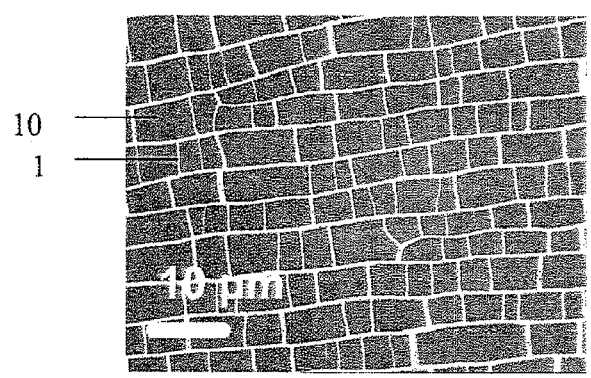

The effect of the propagation (cf. FIGS. 10 and 11) of a drying front on the morphology of the mask was studied. The presence of a drying front makes it possible to create a network of approximately parallel openings, the direction of which is perpendicular to this drying front. There is, on the other hand, a secondary network of openings approximately perpendicular to the parallel network, for which the location and the distance between the openings are random.

At this stage of the implementation of the process, a network mask 1 is obtained.

Figure 9:
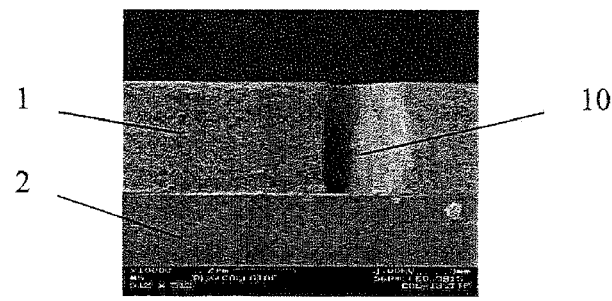
FIG. 9 is an SEM view illustrating the profile of the network mask.

A morphological study of the mask showed that the openings have a straight opening profile. Reference can be made to FIG. 9 which is a transverse view of the mask 1 on the substrate 2 obtained using SEM.

The profile of the openings 10 (in other words of the mask zones) represented in FIG. 9 has a particular advantage for:

depositing a large thickness of materials; and retaining a pattern, in particular of large thickness, that conforms to the mask after having removed the latter.

The mask thus obtained may be used as is or modified by various post-treatments. The inventors have furthermore discovered that the use of a plasma source as a source for cleaning the organic particles located at the bottom of the opening made it possible, subsequently, to improve the adhesion of the material being used as the grid.

According to this configuration, there are no colloidal particles at the bottom of the openings, there will therefore be a maximum adhesion of the material that is introduced in order to fill the opening (this will be described in detail later on in the text) with the substrate having a glass function.

As an exemplary embodiment, cleaning with the aid of an atmospheric-pressure plasma source, with a transferred-arc plasma based on an oxygen/helium mixture, makes it possible both to improve the adhesion of the material deposited at the bottom of the openings and to widen the openings. A plasma source of the brand "ATOMFLOW" sold by Surfx may be used.

In another embodiment, a simple emulsion of colloidal particles based on an acrylic copolymer, which are stabilized in water at a concentration of 50 wt %, a pH of and a viscosity equal to 200 mPa·s is deposited. The colloidal particles have a characteristic dimension of around 118 nm and are sold by DSM under the trademark NEOCRYL XK 38° and have a $T_g$ equal to 71° C. The network obtained is shown in FIG. 12a. The space between the openings is between 50 and 100 μm and the range of widths of the openings is between 3 and 10 μm.

Grid Manufacture

Starting from the mask according to the invention, an electroconductive grid is produced. In order to do this, an electroconductive material such as aluminum, silver, copper, nickel, chromium, alloys of these metals and conductive oxides especially chosen from ITO, IZO, ZnO:Al; ZnO:Ga; ZnO:B; $SnO_2$:F and $SnO_2$:Sb is deposited electrically through the mask. The material is deposited inside the network of openings so as to fill the openings, the filling being carried out to a thickness for example of around half the height of the mask.

For example, a layer of Ag having a thickness of 300 nm is deposited by magnetron sputtering.

This deposition phase may be carried out for example by magnetron sputtering.

Heat Treatment

The influence of a treatment on the parameters for the network was evaluated.

In a first example, the change in the mask deposited with XK38 was compared before heat treatment (FIG. 12a) and after heat treatment (FIG. 12b). The results are compiled in the following table:

| XK38 sample | Heat treatment (temperature, time) | Range of the sizes of openings (μm) | Range of the distances between openings (μm) |
| --- | --- | --- | --- |
| Reference | no | 50-100 | 3-10 |
| Annealed sample | 100° C. 5 min | 50-100 | 6-20 |
| Annealed sample | 100° C. 15 min | 50-100 | 10-25 |

By shrinkage, the width of the openings doubles or even triples as shown in FIG. 12b (sample treated at 100° C. for 15 min).

In a second example, the change in the mask deposited (with an XK38) was compared before heat treatment (cf. FIG. 13a) and after heat treatment at 140° C. for 15 minutes (cf. FIG. 13b). A greater increase in the width of the openings is observed.

Overgrid Manufacture

After heat treatment, the overgrid is deposited through the openings.

In one example, the same material is deposited for the overgrid as for the grid, namely silver. The mask was produced from XK52.

A reference sample is a silver grid that has not undergone heat treatment and is not coated with an overgrid.

The following table shows the change in the optical properties, electrical properties and in the level of occupancy of the strands as a function of the heat treatment. The deposition methods and times of the grid (and of the overgrid) are the same for all the tests.

| XK52 sample | Annealing T (° C.) | Annealing time (min) | R [Ω] | TL (%) | Mean grid and overgrid thickness (nm) | % occupied by the grid and overgrid |
| --- | --- | --- | --- | --- | --- | --- |
| Without overgrid or annealing (ref) | — | — | 10 | 81.2 | 45 | 11.8 |
| With overgrid and annealing | 80 | 5 | 5.02 | 78 | 60 | 14.5 |
| With overgrid and annealing | 80 | 15 | 4.1 | 77.4 | 60 | 15.9 |
| With overgrid and annealing | 140 | 5 | 3.1 | 70.8 | 120 | 20.5 |
| With overgrid and annealing | 140 | 15 | 1.3 | 67.3 | 120 | 25.8 |

The lowering of the sheet resistance (particularly desired for an electrode application) and the increase of the degree of coverage measured for example from an optical photograph and after image processing were observed. The TL is slightly reduced.

Mask Removal

In order to reveal the structure of the grid coated with the overgrid from the mask, a "lift-off" operation is carried out. This operation is facilitated by the fact that the cohesion of the colloids results from weak van de Waals type forces (no binder, or bonding resulting from annealing). The colloidal mask is then immersed in a solution containing water and acetone (the cleaning solution is chosen as a function of the nature of the colloidal particles), then rinsed so as to remove all the parts coated with colloids. The phenomenon can be accelerated due to the use of ultrasound to degrade the mask of colloidal particles and reveal the complementary parts (a network of openings filled by the material), which will form the grid.

Example of Grid with Corrosion-Protective Overgrid

A mask based on XK52 is used.

As grid material, aluminum is deposited by magnetron sputtering at a pressure of $4 \times 10^{-3}$ mbar.

After annealing, a 35 nm layer of silica is deposited as overgrid material.

| XK52 | Annealing | Size of the meshes | Width of the openings | R [Ω] | TL (%) | Mean grid (and overgrid) thickness | % occupied by the grid (and the overgrid) |
|---|---|---|---|---|---|---|---|
| Before annealing | — | 20-40 | 2-4 | 9 | 78 | 300 +/− 50 nm | 13.7 |
| After annealing | 140 (° C.) −15 min | 25-40 | 3-7 | 9 | 78 | 335 +/− 50 nm | 23.1 |

This protected grid may be used for example in an EMI shielding device or heating device typically a wind shield or a radiator or a wall of a cold cabinet (for department stores, shelves, freezing tanks, etc.).

Example of a Grid with Undergrid and Darkening Overgrid

A mask based on XK 52 is used.

Firstly 15 nm of NiCr is deposited through the openings.

As grid material, 200 nm of copper is deposited by magnetron sputtering at a pressure of $10^{-3}$ mbar.

The heat treatment is carried out.

As overgrid material, a 15 nm layer of NiCr is deposited.

| XK52 | Annealing | Size of the meshes | Sizes of the openings before annealing | R [Ω] | TL (%) | % occupied by the grid (and the overgrid) |
|---|---|---|---|---|---|---|
| Before annealing | — | 30-50 | 4 +/− 0.5 μm | 1.5 | 79 | 14 |
| After annealing | 110 (° C.) −10 min | 25-40 | 4.5 +/− 0.5 μm | 1.2 | 77 | 23.1 |

The four sides of the grid strand become black, esthetic. In grazing incidence, the coated grid appears black over all the faces.

This esthetic grid is used for example for a flat lamp electrode or electrochromic electrode, for a screen, products for which the depiction of the colors is exacting.

The invention claimed is:

1. A process for manufacturing a submillimetric electroconductive grid coated with an overgrid on a main face of a substrate comprising:
    producing a network mask having submillimetric openings on the main face, the producing including:
        depositing a masking layer from a solution of colloidal polymeric nanoparticles that are stabilized and dispersed in a solvent, the polymeric nanoparticles having a glass transition temperature $T_g$; and
        drying the masking layer at a temperature below said temperature $T_g$ until the network mask having a network of openings is obtained, the openings separating mask zones with substantially straight edges in the network mask;
    forming the electroconductive grid from the network mask, the forming comprising depositing at least one electroconductive grid material until a fraction of the depth of the openings is filled;
    heat treating the masking layer with the electroconductive grid material at a temperature greater than or equal to 0.8 times $T_g$, resulting in a shrinkage of the mask zones, thus creating a space between the edges of the mask zones and lateral edges of the grid;
    forming the overgrid on the grid, the forming of the overgrid comprising depositing an overlayer, made of an overlayer material, on the grid and in the space between the edges of mask zones and the lateral edges of the grid;
    removing the masking layer, until the electroconductive grid coated with the overgrid is revealed.

2. The process as claimed in claim 1, comprising forming an undergrid under the grid by depositing a layer of material through the openings.

3. The process as claimed in claim 1, wherein the temperature of the heat-treatment is less than or equal to 180° C.

4. The process as claimed in claim 1, wherein the temperature of the drying is less than or equal to 50° C.

5. The process as claimed in claim 1, wherein the deposition of the at least one electroconductive grid material, the heat treatment and the deposition of the overlayer are carried out, in the same deposition chamber, without breaking the vacuum.

6. The process as claimed in claim 1, wherein the polymeric nanoparticles are made from polymers: selected from the group consisting of acrylic copolymers, polystyrenes, poly(meth)acrylates, polyesters and blends thereof.

7. The process as claimed in claim 1, wherein the solution is aqueous.

8. The process as claimed in claim 1, wherein the masking layer is removed by a solvent.

9. A method comprising providing a coated electroconductive grid manufactured by the process as claimed in claim 1 as an active layer in an electrochemical and/or electrically controllable device having variable optical and/or energy properties.

10. The process as claimed in claim 1, wherein the overgrid comprises a corrosion-protective layer made of NiCr or Cr.

11. The process as claimed in claim 1, wherein the overlayer is a darkening layer, with a purity in reflection Pe of less than 10% and a dominant wavelength in reflection around 480 nm.

12. The process as claimed in claim 1, wherein the electroconductive grid comprising strands having a ratio of a distance between strands of the grid to a submillimetric width of the strands is between 7 and 40.

13. The process as claimed in claim 12, wherein the width of the strands is between 200 nm and 50 μm and the distance between the strands is between 5 and 500 μm.

14. The process as claimed in claim 1, wherein the electroconductive grid has a sheet resistance between 0.1 and 30 ohm/square.

15. The process as claimed in claim 1, wherein a light transmission of the substrate and of the coated grid is between 70% and 86%.

16. The process as claimed in claim 2, wherein the undergrid provides an adhesion layer for the grid on the substrate.

17. The process as claimed in claim 2, wherein the undergrid is a barrier to alkali metals.

18. The process as claimed in claim 3, wherein the temperature of the heat-treatment is less than or equal to 150° C.

19. The process as claimed in claim 9, wherein the temperature of the drying is ambient temperature.

20. The method as claimed in claim 9, wherein the active layer is a heating layer or an electrode of the device.

21. The method as claimed in claim 9, wherein the device is a liquid crystal device, or a photovoltaic device, or a light-emitting device, or a heating device, or an electromagnetic shielding device.

22. The method as claimed in claim 21, wherein the light-emitting device is an organic or inorganic light-emitting device.

* * * * *